United States Patent [19]

Burns

[11] Patent Number: 5,586,009
[45] Date of Patent: Dec. 17, 1996

[54] BUS COMMUNICATION SYSTEM FOR STACKED HIGH DENSITY INTEGRATED CIRCUIT PACKAGES

[75] Inventor: Carmen D. Burns, Austin, Tex.

[73] Assignee: Staktek Corporation, Austin, Tex.

[21] Appl. No.: 630,083

[22] Filed: Apr. 9, 1996

Related U.S. Application Data

[60] Continuation of Ser. No. 506,309, Jul. 24, 1995, Pat. No. 5,552,963, which is a division of Ser. No. 440,500, May 12, 1995, Pat. No. 5,479,318, which is a division of Ser. No. 206,829, Mar. 7, 1994, Pat. No. 5,455,740.

[51] Int. Cl.$^6$ .............................. H05K 7/00; H01R 9/00
[52] U.S. Cl. .......................... 361/735; 361/773; 361/775; 361/813; 257/685; 257/686; 257/690; 257/692; 257/777
[58] Field of Search ..................... 361/729, 735, 361/772–776, 743–745, 790, 813; 437/208, 915; 257/777, 690–694, 696, 685–686

*Primary Examiner*—Bot L. Ledynh
*Attorney, Agent, or Firm*—Fulbright & Jaworski L.L.P.

[57] ABSTRACT

The present invention is a rail-less bus system for a high density integrated circuit package, or module, made up of a plurality of vertically stacked high density integrated circuit devices. Each device has leads extending therefrom with bifurcated or trifurcated distal lead ends which electrically connect with lead ends of adjacent integrated circuit devices. The bus system provides a path for communication from the module to external electronic devices and internal communication between the individual integrated circuit devices in the module.

1 Claim, 5 Drawing Sheets

BUS COMMUNICATION SYSTEM FOR STACKED HIGH DENSITY INTEGRATED CIRCUIT PACKAGES

CROSS-REFERENCE TO RELATED APPLICATIONS

This application is a continuation of application Ser. No. 08/506,309, filed Jul. 24, 1995, U.S. Pat. No. 5,552,962 which is a divisional of application Ser. No. 08/440,500, filed May 12, 1995, now U.S. Pat. No. 5,479,318, which is a divisional of application Ser. No. 08/206,829, filed Mar. 7, 1994, now U.S. Pat. No. 5,455,740.

BACKGROUND OF THE INVENTION

1. Field of the Invention

This invention relates to high density integrated circuit devices. More particularly, this invention relates to an external bus communication system for high density integrated circuit devices stacked to form ultra high density integrated circuit packages, or modules.

2. Discussion of Related Art

Designers of computers and other electronic systems constantly strive to use integrated circuit devices which are smaller and more complex. Because of this demand, there is a need to develop smaller, yet denser, memory packages, or modules, and other small, yet dense, modules containing dissimilar integrated circuit devices, such as microprocessors, memory devices, DMA devices, etc. Typically, these modules require external electrical connections to other modules within the same electronic device or external electronic circuits, and internal communication paths, or buses, for data communication between the discrete semiconductor elements within the module itself.

The problem then has arisen with regard to how to create electronic pathways, or buses, for stacked high density integrated circuit modules which are physically external to the high density module and provide an external communication path from each integrated circuit package within the module to external electronic devices, and a communication path for communication between individual integrated circuit packages within the module.

Various schemes have been developed to provide these buses. A rail bus system is described in application Ser. No. 08/059,401, pending, owned by the common assignee of the present invention. An alternative, rail-less bus system is exemplified in U.S. Pat. No. 4,884,237.

Rail-less bus systems are typically less costly to produce. A major drawback with known rail-less bus systems is that a maximum of two industry standard integrated circuit devices, or level-one packages, can be vertically stacked, with non-common signal external leads on either the upper or lower package jumpered together, and common signal leads on each package placed into contact with each other. This type of rail-less bus scheme described in U.S. Pat. No. 4,884,237 is additionally limited because it requires that standard packages with industry standard pin assignments be used, including a chip select pin and a no-connect pin.

SUMMARY OF THE INVENTION

The present invention is for a high density integrated circuit package, or module, made up of a plurality of vertically stacked individual high density integrated circuit devices. Throughout this specification, single integrated circuit packages will be sometimes referred to as level-one packages, while stacked modules made up of two or more level-one packages will be referred to as level-two packages.

This invention can be used with commercially available TSOP devices, custom thin, high density integrated circuit devices and packages utilizing lead-on-chip (LOC) or lead-on-package (LOP) lead frame configurations. Examples of such LOC and LOP lead frame configurations are described in U.S. Pat. No. 5,221,642 and U.S. application Ser. Nos. 07/783,737 and 07/990,334, both pending, all owned by the common assignee of the present invention.

In one embodiment of this invention, leads with bifurcated or trifurcated distal ends, extend from each level-one package within the level-two package. The lead ends from adjacent level-one packages are electrically connected with each other, thus forming an external electronic pathway, or bus, for providing signal communication between the level-one packages within the level-two package and external modules or electronic circuits.

It is an object of the present invention to provide a rail-less bus system for providing data communication between a high density level-two integrated circuit module and external electronic devices. It is another object of the present invention to provide a bus system for communication between the individual vertically stacked level-one packages which make up the module and external electronic devices.

It is a further object of the present invention to provide a level-one package with bifurcated or trifurcated distal lead ends which are electrically connected to similar lead ends which extend from adjacent level-one packages within the high density package, or module.

It is another object of the present invention to provide a level-one package with bifurcated or trifurcated distal lead ends on a LOP lead frame which are electrically connected to similar lead frame ends which extend from adjacent LOP leads.

A still further object of the present invention is to provide a relatively low cost signal communication system, or bus, which provides electronic communication between a high density level-two package and external electronic circuitry.

These and other objection are accomplished by the present invention and are described in more detail below.

DETAILED DESCRIPTION OF THE PREFERRED EMBODIMENT

Figure 1:
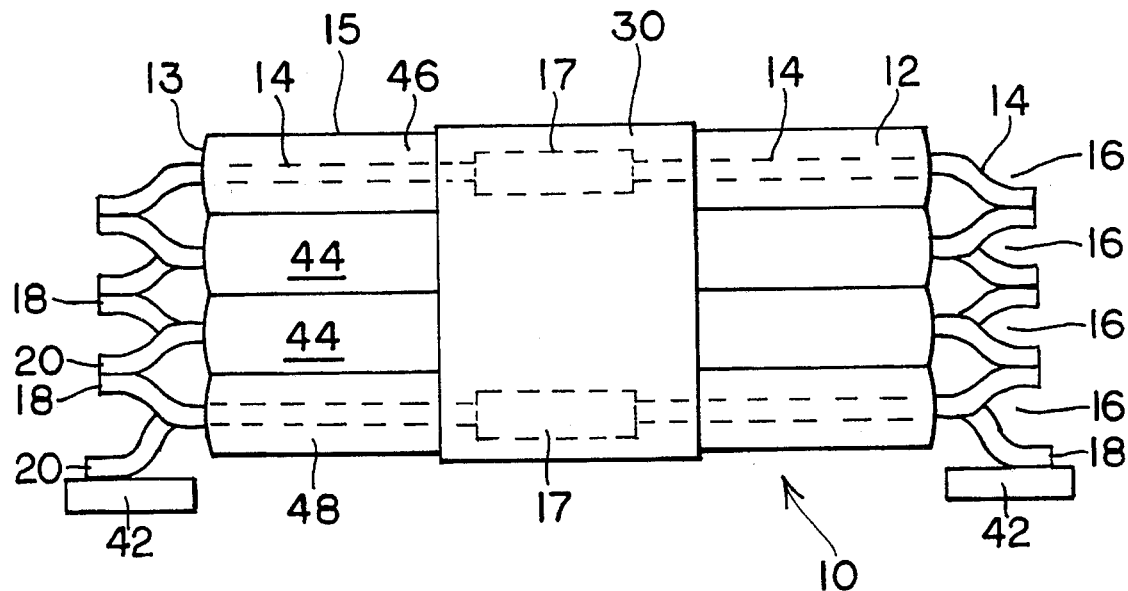
FIG. 1 illustrates an embodiment of the module or level two package of the present invention with bifurcated lead ends.
Figure 2:
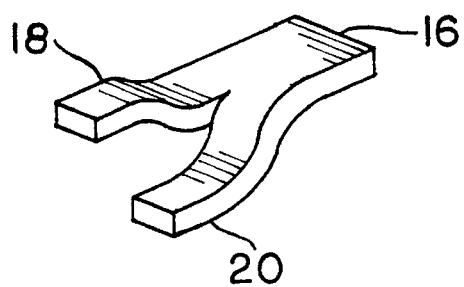
FIG. 2 illustrates a bifurcated lead end of a lead of an embodiment of the present invention.

The present invention is for a bus communication system for a high density level-two package, or module, 10 shown in FIG. 1. Module 10 is made up of a plurality of vertically stacked individual level-one integrated circuit packages 12. FIG. 1 shows an embodiment with bifurcated distal lead ends 16. Each level-one package 12 has leads 14 which extend through a side wall 13 of the package casing 15. The leads 14 have bifurcated distal lead ends 16, as shown in FIG. 2. Each distal lead end 16 has a first finger 18 and a second finger 20. Either or both fingers of any lead end 16 may be removed during assembly of module 10, depending on the bus configuration desired.

As shown in FIG. 1, lead fingers 18 and 20 from adjacent stacked high density integrated circuit devices 12 within module 10 are electrically coupled. The distal lead ends 16 from adjacent level-one packages 12 which are physically and electrically connected are formed so as to exert a mild spring load on each other to enhance physical and electrical contact.

Figure 3:
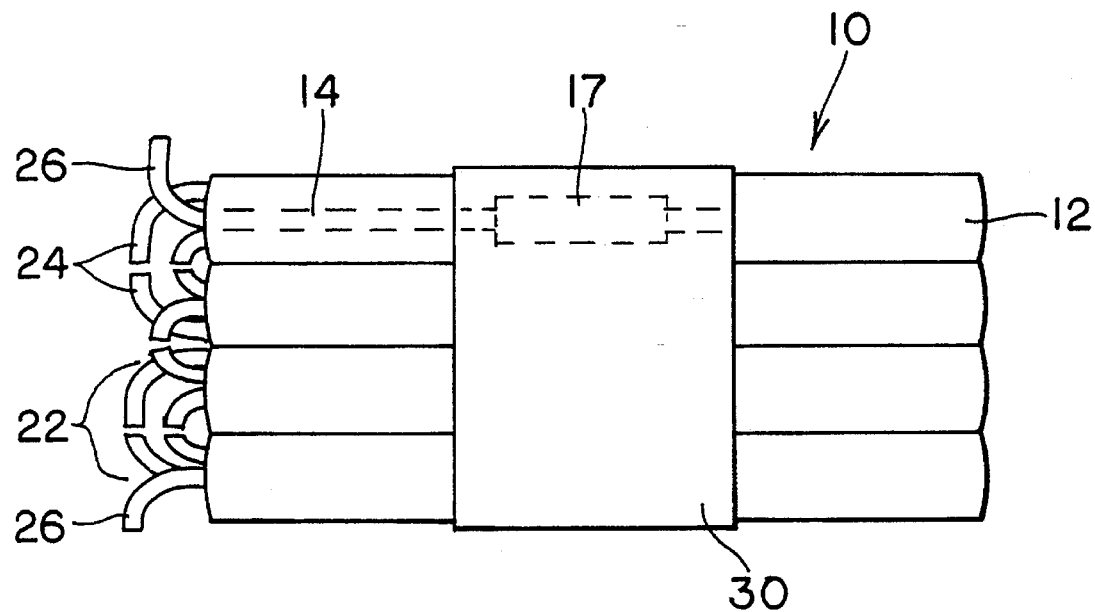
FIG. 3 illustrates another embodiment of the module or level-two package of the present invention with trifurcated lead ends shown on one side of the package.

In another embodiment shown in FIG. 3, a module or level-two package 10 may include a vertical stack of level-one packages 12 which contain trifurcated distal lead ends 22. Each trifurcated distal lead end 22 has a first and second outside lead end finger 24 and a central lead end finger 26, shown in FIG. 4.

As shown in FIG. 3, the first or second outside lead end finger 24 of each stacked high density device 12 is physically and electrically connected to an outside lead end finger 24 of an adjacent level-one package 12. The outside lead end fingers 24 of adjacent packages 12 are pre-loaded to exert a mild spring load on each other to facilitate physical and electrical contact.

As shown in the embodiment illustrated in FIG. 1, within module 10 are intermediate stacked level-one packages 44, an uppermost level-one package 46 and a lowermost level-one package 48. Distal lead ends 16 of each intermediate level-one package 44 are physically and electrically connected to lead ends 16 of the level-one packages, one above and one below. The first or second lead end finger 18 or 20 of the lead ends 16 of each intermediate level-one package 44 is physically and electrically connected to a corresponding first or second lead end finger 18 or 20 of the lead ends 16 of an adjacent uppermost 46, intermediate 44 or lowermost level-one package 48. The number of intermediate level-one packages 44 in any configuration may vary, depending on the specific application involved.

The lead ends 16 of the uppermost level-one package 46 in FIG. 1 and the lowermost level-one package 48 are physically and electrically connected only to the lead ends 16 of one adjacent intermediate level-one package 44. This connection is made by connecting either the first or second lead end finger 18 or 20 of the lead ends 16 of the uppermost package 46 and the lowermost package 48 to a corresponding first or second lead end finger 18 or 20 of the lead ends 16 of the adjacent intermediate level-one package 44. The remaining first or second lead end finger 18 or 20 of the lead ends 16 of the lowermost level-one package 48 can be removed or physically and electrically connected to an external signal pad 42 to provide an electronic communications link from module 10 to external electronic devices (not shown). Shown in FIG. 5, the remaining first or second lead end finger 18 or 20 of the lead ends 16 of the uppermost level-one package 46 can be physically and electrically connected to a heat spreader 36 disposed on the top surface of module 10. Heat spreader 36 may also serve as a ground plane to reduce system noise.

By electrically interconnecting the bifurcated or trifurcated distal lead ends 16 or 22, respectively, of the level-one packages 12 in module 10, a rail-less bus system is achieved for providing data communication between the individual high density level-one packages 12 within module 10, and between external electronic devices (not shown) and the level-one package 12 within module 10. Selective connections between leads of adjacent level-one packages and/or lead frames can be made by either removing the external lead ends not to be connected or by internally (inside the casing) disconnecting the non-selected leads during the manufacturing process. Selective interconnection can also be provided in a four-level stack, for example, by generating a set of four lead sets, one for each particular level. These level designated lead sets can be made from identical lead set stock which is modified by purchasing, etching or other suitable means. Furthermore, while not preferred, the bifurcation or trifurcation of the lead ends can begin at a point which is within the casing material.

Figure 6:
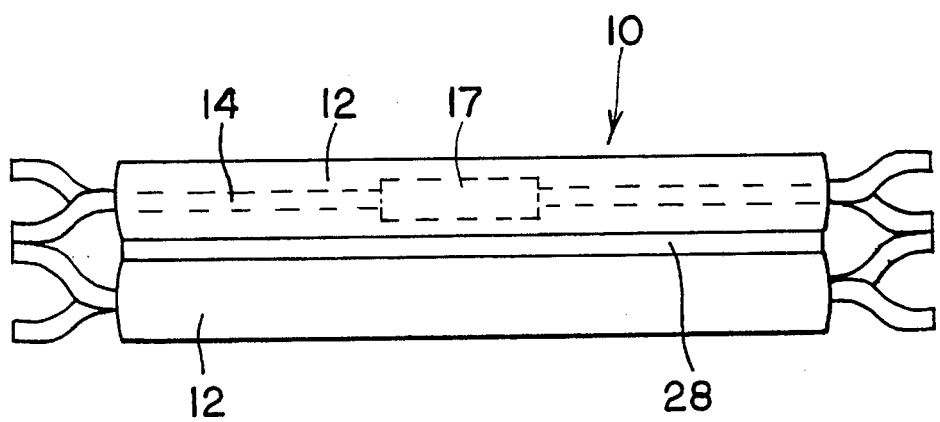
FIG. 6 illustrates an embodiment of the module or level-two package of the present invention with bifurcated lead ends and an adhesive layer between vertically stacked devices in the package.

The level-one packages 12 can be bound together to form a level-two module 10 by applying a thin, high temperature, thermally conductive adhesive material layer 28, shown in FIG. 6, between each vertically stacked high density device 12. The adhesive layer 28 may be a high temperature silicon adhesive, such as du Pont Kapton™ two-sided adhesive tape, or a suitable high temperature epoxy adhesive.

As shown in FIG. 1, in addition to using the high temperature adhesive layer 28 to bond the packages 12 together, a high temperature adhesive band 30 may be used. Band 30 may be a continuous band of material which may be a high temperature silicon adhesive, du Pont Kapton™ tape, or an appropriate high temperature epoxy adhesive. Band 30 is preferably applied to module 10 so that it completely surrounds module 10.

Alternatively, or in addition to use of a continuous band 30, adhesive may be applied to one or both ends of the module 10 using a high temperature epoxy adhesive or high temperature silicon adhesive to secure the level-one packages 12 together. Alternatively, the entire level-two package, or module, 10 may be glued together using a high temperature silicon adhesive, or high temperature epoxy adhesive, to securely bond the level-one packages 12. As a further alternative method of securing the packages 12 together, module 10 may be dipped in a conformal coating mixture. The conformal coating is then cured. All or some portion of the conformal coating may then be removed from the bottom of module 10 using known methods to allow module 10 to be securely fastened to an integrated circuit board header or other device or mounting platform.

In addition to a top cap 32, a bottom mounting adaptor 33 (shown in FIG. 7) may be attached or mounted to module 10. Adaptor 33 for module 10 may be a PGA adaptor which would allow module 10 to communicate with a greater variety of external electronic devices. The PGA adaptor also would allow module 10 to be more easily socketed into a standard industry circuit board or device.

Figure 7:
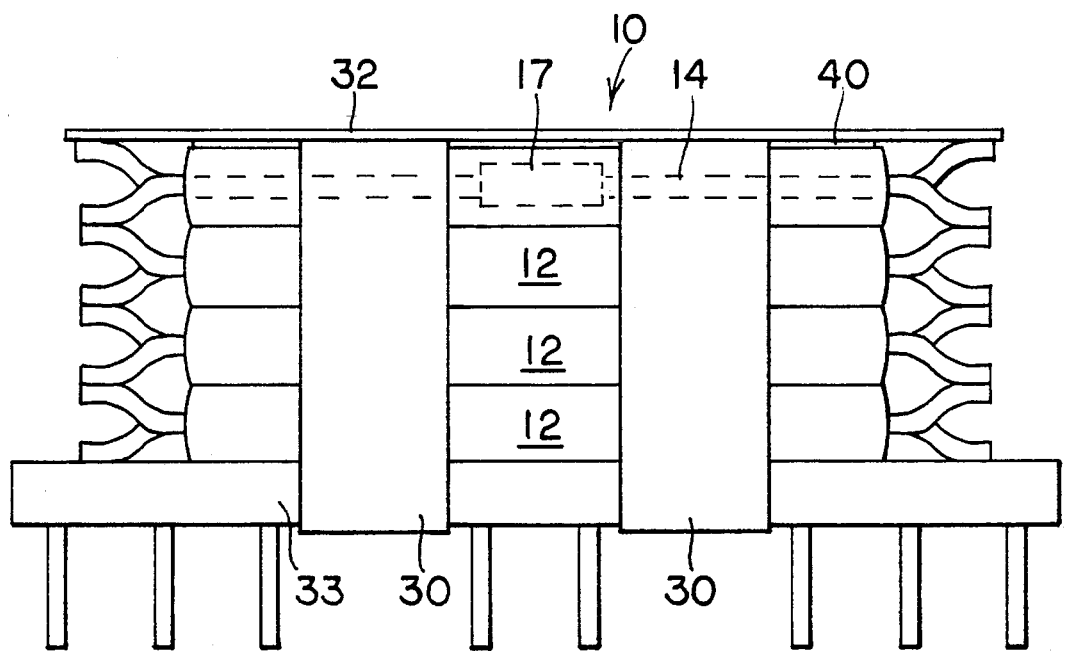
FIG. 7 illustrates an embodiment of the module or level-two package of the present invention with a top cap and bottom mounting adaptor.

As shown in FIG. 7, band 30, made of an appropriate high temperature silicon adhesive, double-sided Kapton™ tape or a suitable high temperature epoxy adhesive, may be used to assemble cap 32, adaptor 33, and all level-one packages 12 of module 10. A plurality of bands 30 may also be used instead of a single band 30. Band 30 applies pressure to cap 32 and adaptor 33 of module 10 while surrounding module 10, thereby securing the level-one packages 12 within module 10. The pressure exerted by band 30 also aids the bifurcated distal lead ends 16 in maintaining a mild spring force pressure against each other to thereby maintain better electrical contact.

Figure 4:
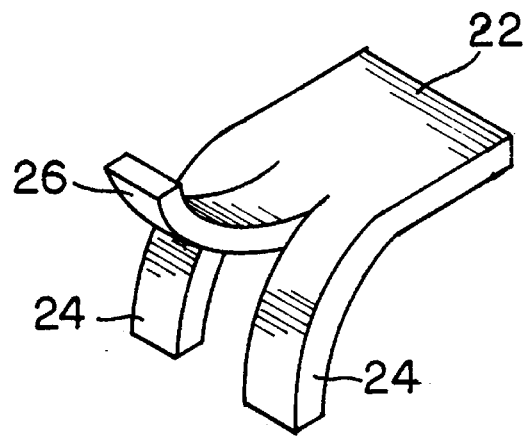
FIG. 4 illustrates a trifurcated lead end of a lead of an embodiment of the present invention.
Figure 8:
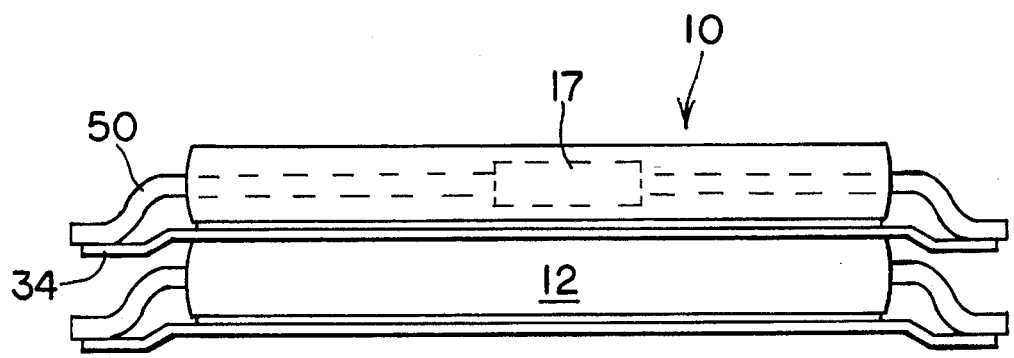
FIG. 8 illustrates an additional embodiment of the module or level-two package of the present invention with an intermediate lead frame.
Figure 9:
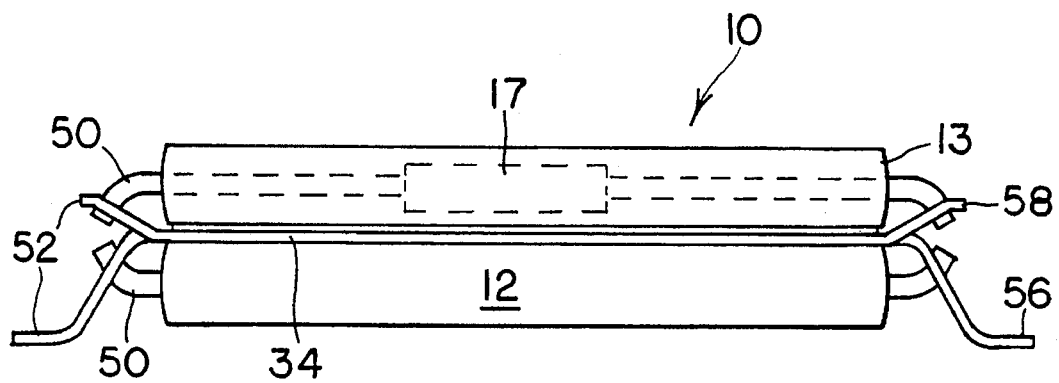
FIG. 9 illustrates an embodiment of the module or level-two package of the present invention with a bifurcated intermediate lead frame.

An intermediate lead frame 34, in embodiments utilizing a lead-on-package (LOP) configuration, shown in FIGS. 8 and 9, may be disposed external to one or more level-one packages 12 in the level-two stack 10, causing frame 34 to be disposed between adjacent level-one packages 12 within module 10. Intermediate lead frame 34 may contain bifurcated distal lead end 52 or trifurcated distal lead ends 22 (FIG. 4). In the embodiment shown in FIG. 9, the overall height of module 10 is preferably less than 90 mils. The bifurcated lead ends 52 or trifurcated lead ends 22 can be electrically connected to circuit conductive elements 50 extending through the sides of packages 12.

Figure 5:
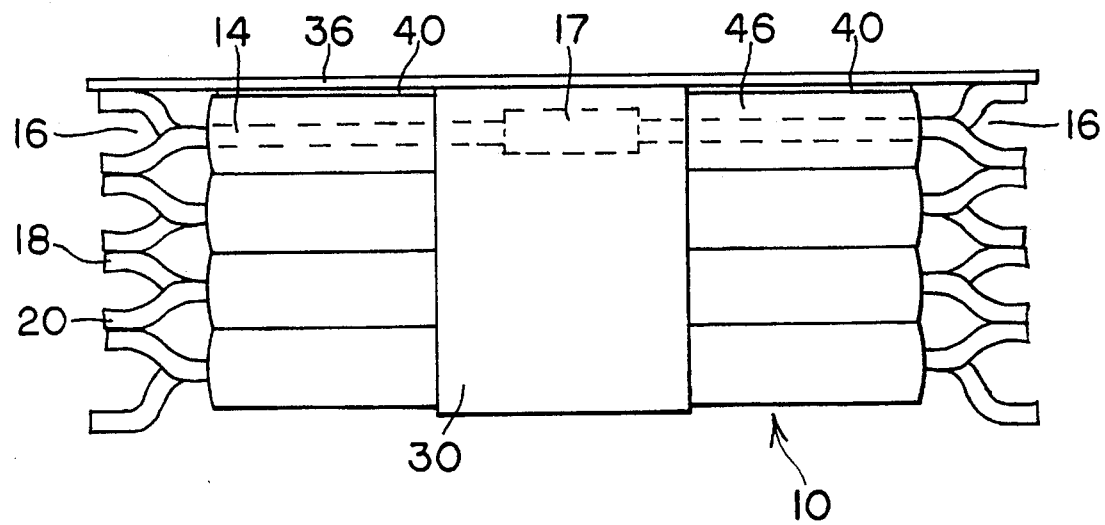
FIG. 5 illustrates a further embodiment of the module or level-two package of the present invention with bifurcated lead ends and a heat spreader.
Figure 10:
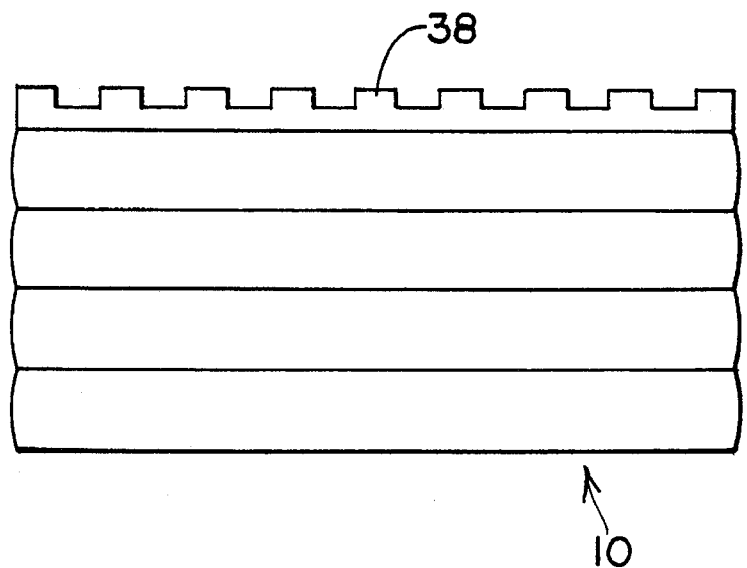
FIG. 10 illustrates another embodiment of the module or level-two package of the present invention, with leads not shown, with heat conducting fins.

A heat spreader 36, shown in FIG. 5, may be disposed on the top surface of module 10 to aid in heat dissipation from module 10. Preferably, heat spreader 36 is made of a high temperature thermally conductive material, such as metal, or a high temperature heat conductive plastic or composite material. Heat spreader 36 may also include a plurality of fins 38 disposed on top of module 10, shown in FIG. 10. The fins 38 may be made of heat conducting material, such as metal, high temperature plastic, or any other suitable high temperature conductive material.

Mounting pads 40, as shown in FIG. 5, may be mounted to top cap 32 of FIG. 7 of module 10 for surface mounting heat spreader 36 to module 10. Mounting pads 40 may be mounted to top cap 32 by the use of any appropriate high temperature silicon adhesive, epoxy adhesive or Kapton™ tape. Alternatively, where top cap 32 is not used, mounting pads 40 may be surface mounted to the top surface of the uppermost level-one package in module 10. Heat spreader 36 can then be mounted to mounting pads 40 to aid heat dissipation from module 10.

In a further alternative method of attaching mounting pads 40 to module 10, mounting pads 40 may be first mounted to heat spreader 36 by the methods previously discussed. Heat spreader 36 may then be mounted to either top cap 32 of FIG. 7 or the top surface of the uppermost high density device 46 in module 10.

Mounting pads 40 may be made of a suitable high temperature thermally conductive material, such as Kapton™ tape, or other suitable material. Heat sink 36 should be attached to top cap 32 of FIG. 7 or the uppermost high density device 46 of module 10 before conformal coating or high temperature glue is applied to the upper surface of module 10. Mounting pads 40 may not easily adhere to the glue or conformal coating if the glue or conformal coating is applied to the upper surface of module 10 before mounting pads 40 are attached.

As previously described, the present invention may be used in a lead on package (LOP) configuration, shown in FIG. 9. There, circuit conductive elements 50, which extend through side wall 13 of each integrated circuit level-one package, or device, 12 in module 10, are interleaved with and physically and electrically connected with bifurcated distal lead ends 52 of an intermediate lead frame 34. Intermediate lead frame 34 is disposed externally to the protective casing surrounding package 12. A first lead end finger 58 of each bifurcated distal lead end 52 of lead frame 34 is electrically connected to a conductive element 50 of one level-one package 12 and the second lead end finger 56 of lead frame 34 is physically and electrically connected to the circuit conductive element 50 of an adjacent level-one package 12. To make these electrical connections, the circuit conductive elements 50 are bent into physical and electrical contact with the respective lead end fingers 58 or 56 of bifurcated distal lead ends 52 of intermediate lead frame 34.

Heat spreader 36, if made of an electrically conductive material such as metal, may be electrically connected to module 10 power supply ground to reduce system noise for module 10. As shown in FIG. 5, a lead end finger 18 or 20 of each bifurcated distal lead end 16 of the level-one package 46 in module 10 may be physically and electrically connected to heat spreader 36 to provide this ground connection.

As shown in FIG. 1, a lead end finger 18 or 20 of each lead 14 of the lowermost level-one package 48 in module 10 may be electrically connected to an external signal pad 42 on the integrated circuit board (not shown) which contains module 10. By making this external signal connection, the level-one packages 12 of module 10 may communicate via the rail-less bus system to external electronic devices (not shown). Thus, an external bus communication system is achieved as well as an internal bus communication system for data and other signal communication between the individual high density devices 12 of module 10.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. An integrated circuit module, comprising:

an assembly of integrated circuit packages, wherein each of said packages includes an upper and lower surface and a perimeter edge;

wherein said packages are vertically stacked and are in surface contact with one another;

wherein each of said packages includes an integrated circuit die and a plurality of electrical leads coupled to said die, said leads extending through said perimeter edge;

wherein said packages are mounted within said module with the lower surface of one package being adjacent to the upper surface of another package in a stacked configuration so as to align said electrical leads of one of said packages with those of another said packages;

wherein some of said leads are bifurcated at their distal end to provide an upper and a lower lead extension;

wherein upper and lower lead extensions from adjacent packages are electrically and thermally coupled;

wherein said bifurcated lead extensions comprise a first and a second lead end finger; and wherein said first or said second lead end finger on the leads of at least one of said stacked integrated circuit packages is electrically connected to a first or a second lead end finger of the leads of an adjacent integrated circuit packages and the remaining lead end finger of the leads is electrically connected to an external signal path.

* * * * *